United States Patent
Kim et al.

(10) Patent No.: US 8,284,117 B2
(45) Date of Patent: Oct. 9, 2012

(54) ANTENNA DEVICE AND METHOD OF MANUFACTURING THE SAME

(75) Inventors: Ki-Hyun Kim, Gyeonggi-do (KR); Seok-Myong Kang, Yeongin-si (KR); Se-Ho Park, Suwon-si (KR); Woo-Ram Lee, Gimpo-si (KR)

(73) Assignee: Samsung Electronics Co., Ltd (KR)

( * ) Notice: Subject to any disclaimer, the term of this patent is extended or adjusted under 35 U.S.C. 154(b) by 471 days.

(21) Appl. No.: 12/644,753

(22) Filed: Dec. 22, 2009

(65) Prior Publication Data

US 2010/0156749 A1 Jun. 24, 2010

(30) Foreign Application Priority Data

Dec. 22, 2008 (KR) .................. 10-2008-0131193

(51) Int. Cl.
*H01Q 7/00* (2006.01)
(52) U.S. Cl. .............. 343/866; 343/700 MS; 343/873
(58) Field of Classification Search ........... 343/700 MS, 343/741, 872, 873, 866
See application file for complete search history.

(56) References Cited

U.S. PATENT DOCUMENTS 6,879,258 B2 * 4/2005 Kuroda et al. ............. 340/572.1
7,808,098 B2 * 10/2010 Sugiyama et al. ............ 257/702

FOREIGN PATENT DOCUMENTS

KR 1020070054356 5/2007
KR 1020070066158 6/2007

* cited by examiner

*Primary Examiner* — Tan Ho
(74) *Attorney, Agent, or Firm* — The Farrell Law Firm, P.C.

(57) ABSTRACT

A signal transmitting/receiving antenna device for Radio Frequency Identification (RFID) which executes contactless data communication, and a method of manufacturing the same. The antenna device includes an antenna module including a dielectric film substrate, an antenna pattern which is a conductive pattern printed on the top and bottom sides of the dielectric film substrate, the top and bottom antenna pattern parts being connected to each other through one or more via holes extending through the dielectric film substrate, and top and bottom passivation layers formed on the dielectric film substrate to cover the top and bottom antenna pattern parts; and a radio wave absorbent printed on one of the top and bottom passivation layers of the antenna module.

8 Claims, 2 Drawing Sheets

ANTENNA DEVICE AND METHOD OF MANUFACTURING THE SAME

PRIORITY

This application claims priority under 35 U.S.C. §119(a) to an application entitled "Antenna Device And Method Of Manufacturing The Same" tiled in the Korean Industrial Property Office on Dec. 22, 2008 and assigned Ser. No. 10-2008-0131193, the contents of which are hereby incorporated by reference.

BACKGROUND OF THE INVENTION

1. Field of the Invention

The present invention relates to an antenna device used for a contactless Integrated Circuit (IC) tag which uses Radio Frequency Identification (RFID) technology, and a method of manufacturing the same.

2. Description of the Related Art

Recently, RFID systems, such as contactless IC cards, have come into wide use. The RFID systems contactlessly receive power and information from an external device, such as a reader/writer, by using radio waves, and contactlessly transmit the information to another external device. Such RFID systems include an antenna device for reception/transmission of signals, and an IC chip, and are configured to be capable of wirelessly communicating with an external device.

If an antenna device employed in such an RFID system is positioned adjacent to metal, magnetic flux is converted into over-current in the metal, which makes it impossible to execute communication. As a countermeasure to this, it has been proposed to provide a planar antenna and to attach a radio wave absorbent to the planar antenna.

FIG. 1 is a cross-sectional view showing a conventional antenna device with a planar antenna provided with a radio wave absorbent. As shown in FIG. 1, the conventional antenna device includes a radio wave absorbent 106 attached to the bottom side of a loop antenna 104 with a double side adhesive tape 105. The loop antenna 104 includes an antenna pattern 102 formed on a polyimide (PI) film 101, and an insulating passivation layer 103 formed on the PI film 101 to cover the antenna pattern 102. The antenna pattern 102 is formed by depositing a conductor (e.g. a. metallic conductor, such as copper) layer on the top side of the PI film 101, and then etching the conductor layer through a conventional lithographic process.

Since such a conventional construction has a limit in thinning, it is difficult to satisfy the recent demand of miniaturizing and slimming electronic appliances.

In addition, the individual components of the antenna device, for example, a loop antenna, a double side adhesive tape, and a radio wave absorbent should be manufactured through independent processes, respectively, and then the radio wave absorbent should be attached to the loop antenna with the double side adhesive tape. Consequently, there is a problem in that the manufacturing process of such an antenna device is complicated, and the manufacturing cost is high.

SUMMARY OF THE INVENTION

Accordingly, the present invention has been made to solve as least the above-mentioned problems occurring in the prior art, and the present invention provides an antenna device capable of executing stable communication even if it is mounted adjacent to metal, and being further reduced in thickness as compared to a conventional antenna device, and a method for manufacturing the same.

Also, the present invention provides an antenna device which allows the process of manufacturing the antenna device to be simplified and the manufacturing costs to be reduced, and a method of manufacturing the same.

In accordance with an aspect of the present invention, there is provided a signal transmitting/receiving antenna device for Radio Frequency Identification (RFID) which executes contactless data communication, the antenna device including an antenna module including a dielectric film substrate, an antenna pattern which is a conductive pattern printed on the top and bottom sides of the dielectric film substrate, the top and bottom antenna pattern parts being connected to each other through one or more holes extending through the dielectric film substrate, and top and bottom passivation layers formed on the dielectric film substrate to cover the top and bottom antenna pattern parts; and a radio wave absorbent printed on one of the top and bottom passivation layers of the antenna module.

In accordance with another aspect of the present invention, there is provided a method for manufacturing an antenna device, including forming a first conductive pattern on the bottom side of a dielectric film substrate by printing conductive paste; forming one or more holes through the conductive film substrate; forming a second conductive pattern on the top side of the conductive film substrate by printing conductive paste; forming first and second passivation layers on the first and second conductive patterns, respectively; and printing a radio wave absorbent layer on any one of the first and second passivation layers.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EMBODIMENTS OF THE INVENTION

Hereinafter, embodiments of the present invention will be described with reference to the accompanying drawings. In the following description, a detailed description of known functions and configurations incorporated herein will be omitted when it may make the subject matter of the present invention rather unclear.

Figure 1:
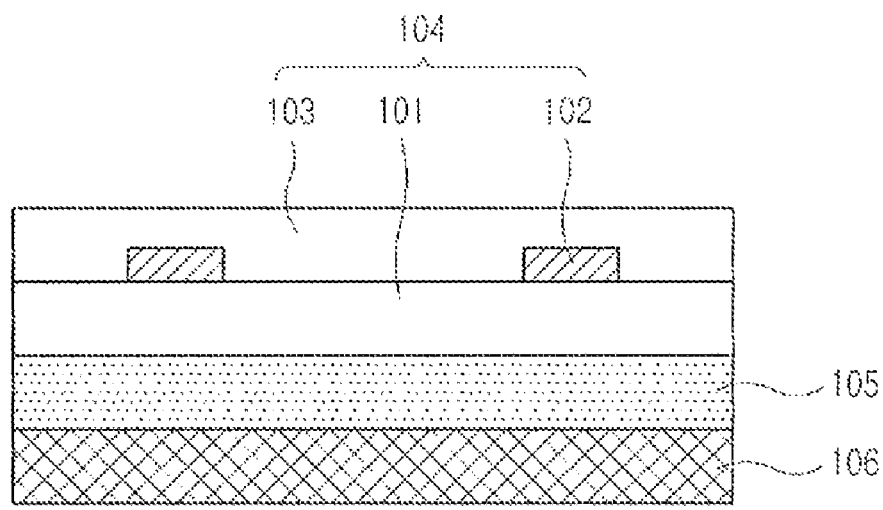
FIG. 1 is a cross-sectional view illustrating a conventional antenna device with a planar antenna provided with a radio wave absorbent.
Figure 2:
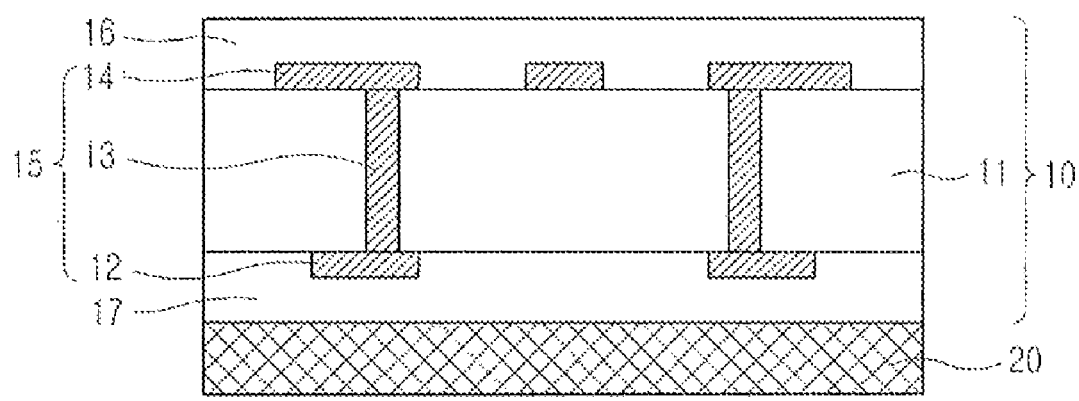
FIG. 2 is a cross-sectional view illustrating the construction of an antenna device according to an embodiment of the present invention.

FIG. 2 is a cross-sectional view illustrating the construction of an antenna device according to an embodiment of the present invention.

Referring to FIG. 2, the inventive antenna device 1 includes an antenna module 10 and a radio wave absorbent 20 formed on the bottom side of the antenna module 10.

The antenna module 10 includes a dielectric film substrate 11, an antenna pattern 15 having conductive patterns 12 and 14 printed on the top and bottom sides of the dielectric film substrate 11, the conductive patterns 12 and 14 being electrically connected with each other through holes 13 formed through the dielectric film substrate 11 and top and bottom passivation layers 16 and 17 formed on the dielectric film substrate to cover the antenna pattern 15.

The dielectric film substrate 11 may be formed from, for example, a thermoplastic resin. For example, the material of the dielectric film substrate 11 may be selected from polyimide, polyethylene terephthalate (PET), polyethylene naphthalate (PEN), polyvinyl chloride (PVC), or the like.

The antenna pattern 15 is printed on the dielectric film substrate in a predetermined pattern, for example, in a loop. Such an antenna pattern 15 may be formed by forming a plating seed layer through a printing process, such as a direct patterning technology using an inkjet process, and then forming a plating layer formed according to the antenna pattern through a plating process. The direct patterning technology is a technology for forming a circuit pattern by directly ejecting a metered quantity of conductive ink, e.g. silver (Ag) ink, to a correct position through an inkjet head.

If the metallic seed layer is selectively formed on the dielectric film substrate 11 according to the antenna pattern through the printing technology as described above, masking and etching processes for removing the metallic seed layer and the plating layer formed beyond the circuit pattern area are not necessary. As a result, there is an advantage in that the material cost can be saved, and the manufacturing steps and time can be reduced.

The top and bottom passivation layers 16 and 17 serve to prevent the oxidation of the antenna pattern 15. The top and bottom passivation layers 16 and 17 are formed from an insulation material.

The radio wave absorbent 20 serves to absorb radio waves produced from a metallic material, or to prevent the radio waves from being produced from the metallic material, wherein the radio wave absorbent 20 is formed from an iron/ nickel (Fe/Ni) and resin composition. The radio wave absorbent 20 may be formed through a printing process like the antenna pattern 15.

By forming a radio wave absorbent on a side of the antenna module through a printing process as described above, it is possible to form the radio wave absorbent as an integral part of the antenna module without using an adhesive member, such as a double side adhesive tape.

Figure 3A:
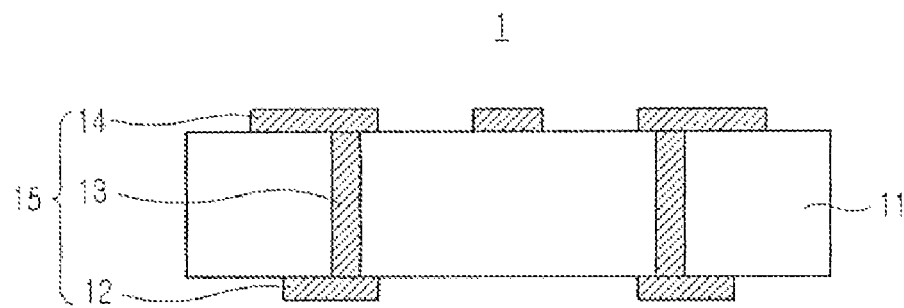
FIGS. 3A to 3C are cross-sectional views illustrating the process of manufacturing the antenna device according an embodiment of the present invention.
Figure 3B:
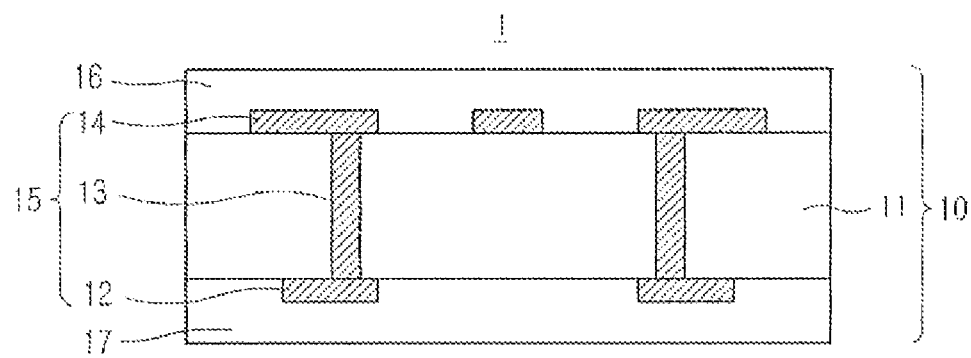
Figure 3C:
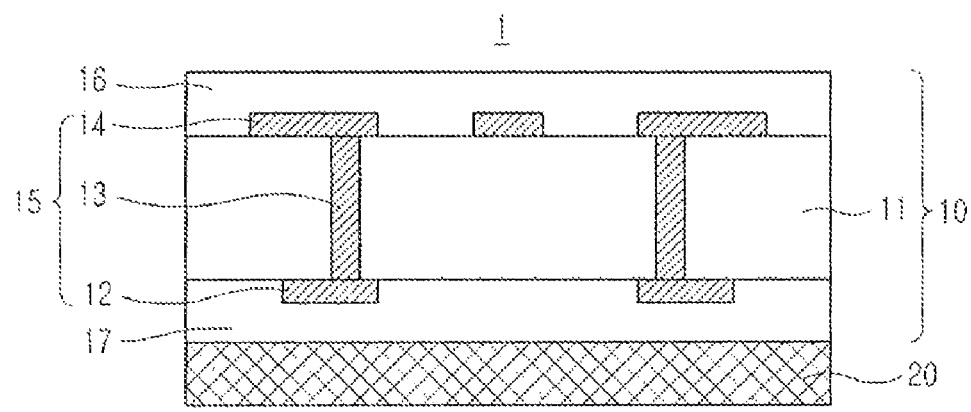

FIGS. 3A to 3C are cross-sectional views illustrating the process of manufacturing the antenna device according to an embodiment of the present invention.

FIG. 3A shows an antenna pattern 15 formed on a dielectric film substrate 11. First, conductive paste is screen-printed on the bottom side of the dielectric film substrate 11, e.g. a polyimide film, thereby forming a plating seed layer, and then holes 13 extending through the dielectric film substrate film 11 are formed through a conventional drilling process. Next, the conductive paste is screen-printed on the top side of the dielectric film substrate 11, thereby forming a plating seed layer. At this time, the holes 13 will be filled with the conductive paste. The dielectric film substrate 11 formed with the plating seed layers is immersed into, for example, a copper plating bath so that the dielectric film substrate 11 can be electrolytically or non-electrolytically plated. Consequently, an antenna pattern 15, which consists of a first conductive pattern 12, holes 13, and a second conductive pattern 14, is formed.

By forming metallic layers through a plating process after forming plating seed layers according to a predetermined antenna pattern through a printing process as described above, it is possible to form a predetermined antenna pattern without chemically or physically etching the metallic layers.

FIG. 3B shows passivation layers 16 and 17 formed on the top and bottom sides of the dielectric film substrate 11 so that the passivation layers cover the first and second conductive patterns 13 and 14, respectively.

FIG. 3C shows a radio wave absorbent 20 formed on any of the top and bottom passivation layers 16 and 17. In the present embodiment, the radio wave absorbent 20 is formed on the bottom passivation layer 17 on the dielectric film substrate 11, wherein the radio wave absorbent 20 may be formed in a desired pattern by forming a metal mask on the passivation layer 17, then printing an Fe/Ni and resin composition with a viscosity of about 20,000 to 70,000 pcs (pieces) over the metal mask using a screen printing apparatus, and then removing the metal mask.

Since it is difficult to form the radio wave absorbent in a desired pattern 20 using a screen printing apparatus if the viscosity of the composition is less than 20,000 pcs and hence too low, or greater than 70,000 pcs, and hence too high, the viscosity is preferably selected within the above-mentioned range.

If the radio wave absorbent is formed directly on a side of the antenna module through a printing process as described above, and integrally formed with the antenna module, it is possible to reduce the thickness of the antenna device and to simplify the manufacturing process of the antenna device.

After the procedure of FIGS. 3A to 3C, the dielectric film substrate formed with the conductive patterns, the passivation layers, and the radio wave absorbent is cut (stamped) into a desired shape. As a result, an antenna device I is formed, which has an antenna module 10 and a radio wave absorbent 20, which are integrated with each other.

In the prior art, such an antenna module and a radio wave absorbent were formed through separate steps, then individually stamped, and then attached to each other with adhesive. By stamping the dielectric film substrate after printing the radio wave absorbent on a side of the antenna module, however, the various steps can be reduced to one stamping step.

Although the present invention has been shown and described with reference to the certain embodiments, various changes and modifications can be made without departing from the spirit and scope of the present invention. For example, although it has been described that antenna patterns are formed on the top and bottom sides of the dielectric film substrate in a single layer by way of an example, such an antenna film may be formed on only one side of the dielectric film. In addition, the antenna film may be formed in plural layers. Therefore, the scope of the present invention shall be determined on the basis of the appended claims and equivalents thereto, rather being limited to the embodiments described above.

What is claimed is:

1. A signal transmitting/receiving antenna device for Radio Frequency Identification (RFID) which executes contactless data communication, the antenna device comprising:
   an antenna module, comprising:
   a dielectric film substrate having a top side and a bottom side;
   an antenna pattern, formed from conductive material, printed on the top and bottom sides of the dielectric film substrate, forming a top antenna pattern part and a bottom antenna pattern part, the top and bottom antenna pattern parts connected to each other through one or more holes extending through the dielectric film substrate; and
   top and bottom passivation layers formed on the dielectric film substrate to cover the top and bottom antenna pattern parts; and a radio wave absorbent printed on one of the top and bottom passivation layers of the antenna module.

2. The antenna device as claimed in claim 1, wherein the dielectric film substrate is formed from a thermoplastic resin formed from at least one of polyimide, polyethylene terephthalate, polyethylene naphthalate (PEN), and polyvinyl chloride (PVC).

3. The antenna device as claimed in claim 1, wherein the antenna pattern has a loop shape.

4. The antenna device as claimed in claim 1, wherein the radio wave absorbent is an iron/nickel (Fe/Ni) and resin composition.

5. A method for manufacturing an antenna device, comprising the steps of:
   forming a first conductive pattern on the bottom side of a dielectric film substrate by printing conductive paste;
   forming one or more holes through the conductive film substrate;
   forming a second conductive pattern on the top side of the conductive film substrate by printing conductive paste;
   forming a first passivation layer on the first conductive pattern;
   forming a second passivation layer on the second conductive pattern; and
   printing a radio wave absorbent layer on one of the first and second passivation layers.

6. The method as claimed in claim 5, wherein the radio wave absorbent is an iron/nickel (Fe/Ni) and resin composition.

7. The method as claimed in claim 6, wherein the radio wave absorbent has a viscosity in the range of about 20,000 to 70,000 cps.

8. The method as claimed in claim 5, wherein the radio wave absorbent has a viscosity in the range of about 20,000 to 70,000 cps.

* * * * *